US012174691B2

(12) United States Patent
Nishikawa (10) Patent No.: US 12,174,691 B2
(45) Date of Patent: Dec. 24, 2024

(54) SEMICONDUCTOR DEVICE WITH FAILURE DETECTION FUNCTION (71) Applicant: RENESAS ELECTRONICS CORPORATION, Tokyo (JP)

(72) Inventor: Takuro Nishikawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 65 days.

(21) Appl. No.: 18/061,776

(22) Filed: Dec. 5, 2022

(65) Prior Publication Data

US 2023/0289248 A1 Sep. 14, 2023

(30) Foreign Application Priority Data

Mar. 9, 2022 (JP) .................................. 2022-036111

(51) Int. Cl.
*G06F 11/00* (2006.01)
*G06F 11/07* (2006.01)

(52) U.S. Cl.
CPC ........ *G06F 11/076* (2013.01); *G06F 11/0736* (2013.01)

(58) Field of Classification Search
None
See application file for complete search history.

(56) References Cited

U.S. PATENT DOCUMENTS

| 5,249,187 A * | 9/1993 | Bruckert ............. G06F 11/2035 714/E11.063 |
| 10,067,153 B2 | 9/2018 | Kasuya |
| 2016/0070610 A1* | 3/2016 | Mizutani ............. G06F 11/0706 714/47.2 |
| 2017/0300392 A1* | 10/2017 | Kang .................. G06F 11/1608 |

FOREIGN PATENT DOCUMENTS

JP 2017-083226 A 5/2017

OTHER PUBLICATIONS

Google Scholar/Patents search—text refined (Year: 2024).*

* cited by examiner

*Primary Examiner* — Christopher S McCarthy
(74) *Attorney, Agent, or Firm* — Rimon P.C.

(57) ABSTRACT

The semiconductor device 10 receives an input signal given from the signal generating unit provided externally by a plurality of receiving units, a receiving unit 12, 13 for generating a plurality of received signals from the received input signal, a plurality of received signals by comparing, an error determination unit 14 for outputting an error notification to the upper system in response to the error between the channels that occurs between the received signals becomes equal to or greater than the threshold value, the threshold count value is stored and a threshold count register 17, the error determination unit 14 waits for the departure of the error notification until the period specified by the threshold count value has elapsed.

8 Claims, 9 Drawing Sheets

SEMICONDUCTOR DEVICE WITH FAILURE DETECTION FUNCTION

CROSS-REFERENCE TO RELATED APPLICATIONS

The disclosure of Japanese Patent Application No. 2022-036111 filed on Mar. 9, 2022, including the specification, drawings and abstract is incorporated herein by reference in its entirety.

BACKGROUND

The present invention relates to a semiconductor device, for example, a semiconductor device having an input interface circuit value obtained by a sensor provided outside is input.

Recently, system control has been carried out based on the input from various sensors.

There are disclosed techniques listed below.

[Patent Document 1] Japanese Unexamined Patent Application Publication No. 2017-83226

Patent Document 1 discloses an example of a signal capture technique from such a sensor.

The semiconductor device described in Patent Document 1 includes a plurality of internal sensors TS1, TS2 for detecting the same detection object, a switching circuit SEL for outputting by switching each of the detection signals from a plurality of internal sensors TS1, TS2 at a predetermined frequency, among the converted signals based on the output of the switching circuit SEL, a correction information extraction circuit 552 for extracting a first frequency component for correcting an output signal of a predetermined external sensor, among the converted signals based on the output of the switching circuit SEL, and an anomaly information extracting circuit 553 for extracting a second frequency component for detecting an abnormality of a plurality of internal sensors TS1, TS2.

SUMMARY

In the technique described in Patent Document 1, the semiconductor device includes an analog-to-digital conversion circuit, data errors occurring between the two channels is processed by software. However, in recent years, in vehicles equipped with a 48V power supply, information processing is performed by a system installed in a 12V power supply system that is insulated from the 48V power supply system by Calvanic insulation. In such a case, the analog-to-digital converter is often provided externally, there is a problem that cannot be applied a technique of functional safety assurance of the semiconductor device described in Patent Document 1.

Other objects and novel features will become apparent from the description of this specification and the accompanying drawings.

According to an embodiment, the semiconductor device receives an input signal given from the signal generating unit provided externally by a plurality of receiving units, and a receiving unit for generating a plurality of received signals from the received input signal, comparing the plurality of received signals, the error notification in response to the error between the channels caused between the received signals becomes equal to or greater than the threshold value and an error determination unit for outputting to the upper system, and a threshold count register threshold count value is stored, the error determination unit waits for the departure of the error notification until the period specified by the threshold count value has elapsed.

According to the foregoing one embodiment, a semiconductor device can compensate for functional safety only by hardware processing.

DETAILED DESCRIPTION

For clarity of explanation, the following description and drawings are appropriately omitted and simplified. Further, in the drawings, the same elements are denoted by the same reference numerals, duplicate description is omitted if necessary.

First Embodiment

A semiconductor device 10 according to a first embodiment receives data stream transmitted from an external component provided to the outside, performs information processing using the data stream. Therefore, it shows a block diagram of an information processing system 1 including the semiconductor device 10 according to the first embodiment in FIG. 1.

Figure 1:
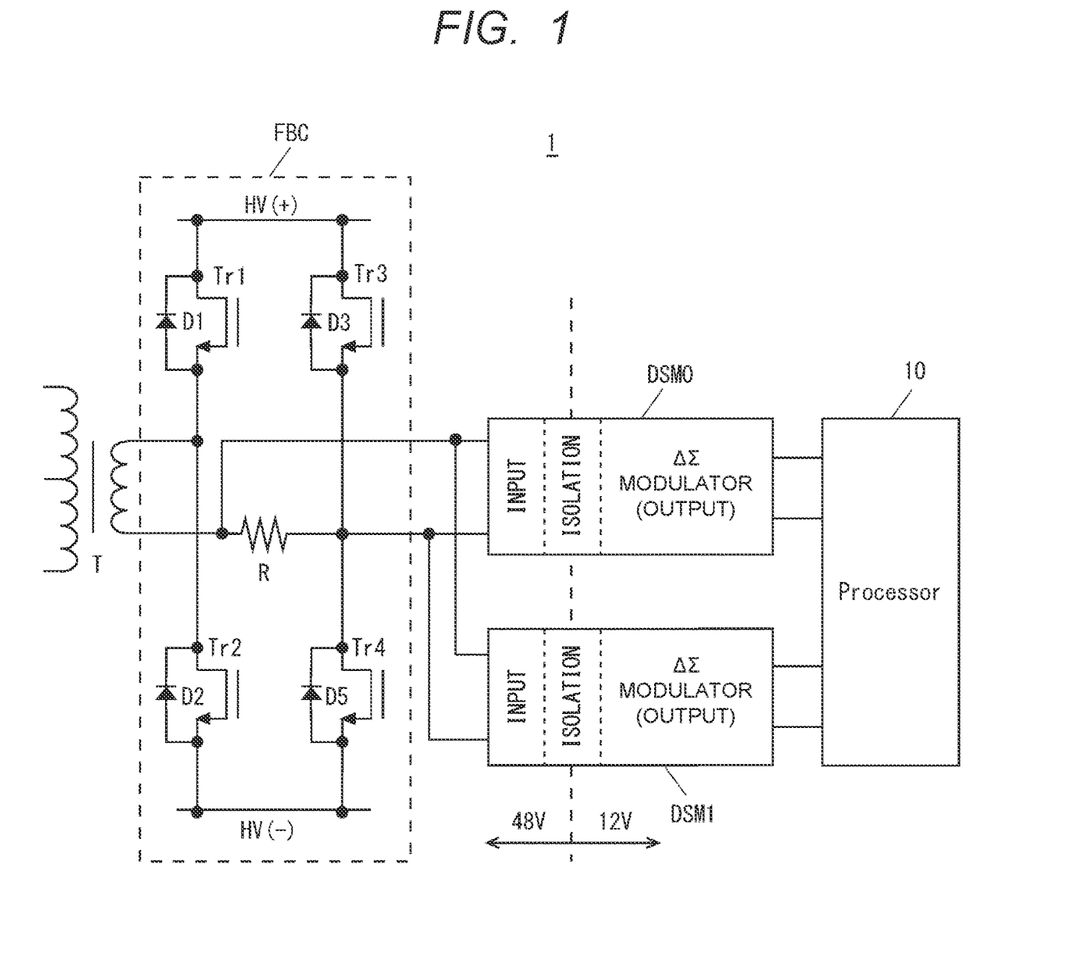
FIG. 1 is a block diagram of an information processing system including a semiconductor device according to a first embodiment.

As shown in FIG. 1, in the information processing system 1 according to the first embodiment, the signal obtained from the sensor via the transformer T is rectified by the full-bridge converter FBC is input to the delta-sigma modulator. At this time, in the information processing system 1 according to the first embodiment, a delta-sigma modulator with two channels is used. In the information processing system 1 according to the first embodiment, the delta-sigma modulator DSM0 and the delta-sigma modulator DSM1 having the same configuration are used.

Each of the delta-sigma modulators DSM0, DSM1 has an input unit for receiving an input signal from the full-bridge converter FBC (INPUT of FIG. 1), an insulating unit (ISOLATION of FIG. 1), and an output unit for outputting the input signal of the semiconductor device 10 (OUTPUT of FIG. 1). Then, in the information processing system 1 according to the first embodiment, an area on the input unit side from the insulating unit is operated by the power supply system of 48V, and an area on the output unit side from the insulating unit is operated by the power supply system of 12V. Further, the insulating unit has a configuration capable of galvanic insulation. Then, the delta-sigma modulator outputs a data stream whose pulse density or pulse width varies according to the magnitude of the analog signal given to the input unit as an input signal of the semiconductor device 10. Incidentally, the delta-sigma modulator is an example of a signal generating unit, as the signal generating unit, it is also possible to use an analog-to-digital conversion circuit or the like for outputting a digital value of a value corresponding to the magnitude of the analog signal.

In the information processing system 1 according to the first embodiment, the semiconductor device 10 receives an input signal to be set to the same value in a plurality of channels, the semiconductor device 10 detects a failure occurring at the input unit of the semiconductor device 10 by detecting an error between a plurality of channels to which the same signal is given. In the exemplary embodiment shown in FIG. 1, a plurality of channels is input interfaces of the semiconductor device 10 where the semiconductor device 10 corresponds to a delta-sigma modulators DSM0, DSM1. Therefore, the configuration of the semiconductor device 10 will be described in detail below.

Figure 2:
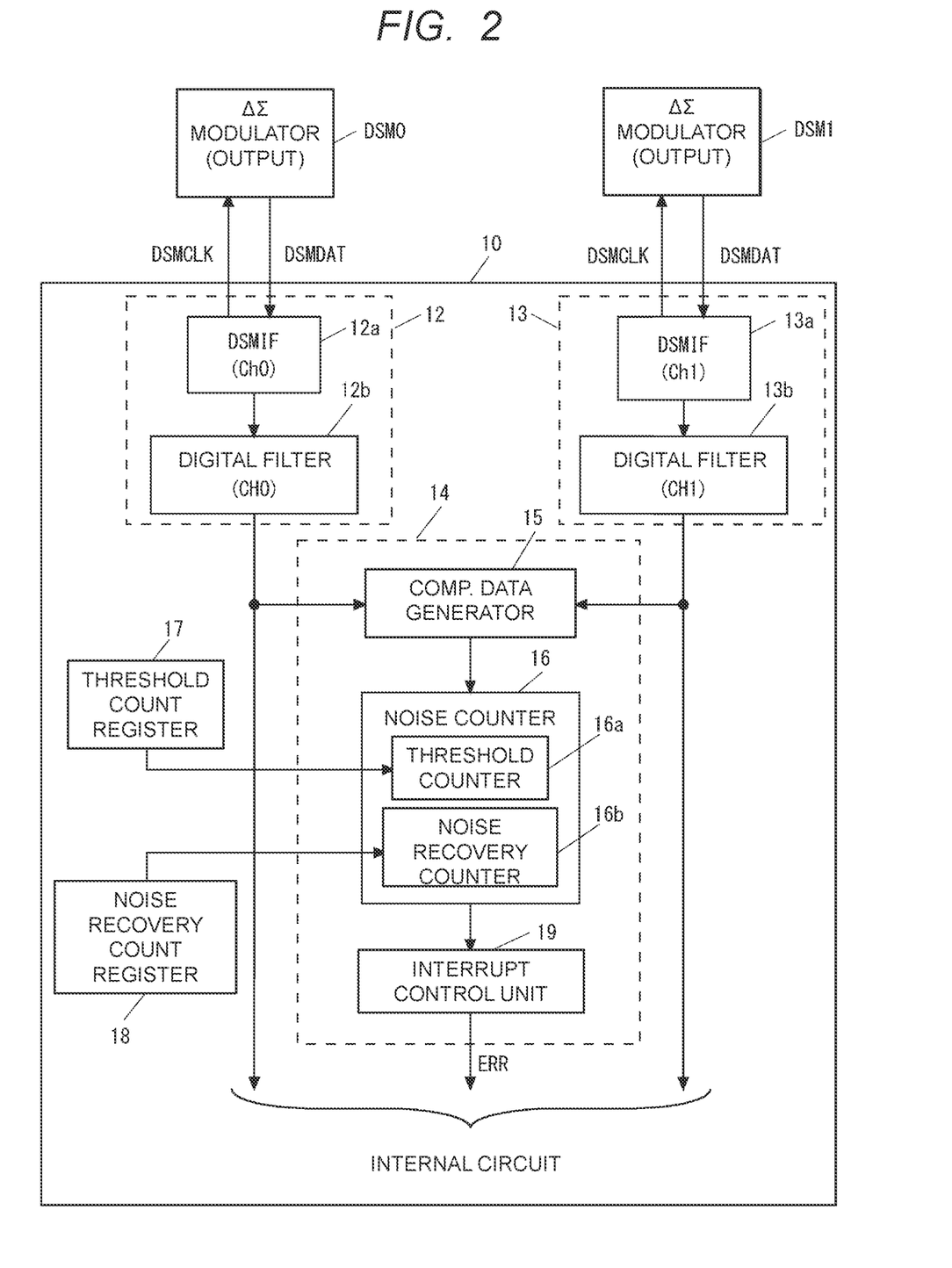
FIG. 2 is a block diagram of a semiconductor device according to the first embodiment.

It shows a block diagram of a semiconductor device 10 according to the first embodiment in FIG. 2. As shown in FIG. 2, the semiconductor device 10 according to the first embodiment has a first receiving unit 12, a second receiving unit 13, an error determination unit 14, a threshold count register 17 and a noise recovery count register 18.

In the information processing system 1 according to the first embodiment, a synchronous clock DSMCLK is transmitted from the semiconductor device 10 to the delta-sigma modulators DSM0, DSM1, and an input signal DSMDAT is transmitted from the delta-sigma modulators DSM0, DSM1 in synchronization with the clock cycle of the synchronous clock DSMCLK to the semiconductor device 10. Here, the input signal DSMDAT is the data stream generated by the delta-sigma modulator. The delta-sigma modulator DSM0 is a first signal generating unit corresponding to the first receiving unit 12, and outputs a first input signal taken by the first receiving unit 12. The delta-sigma modulator DSM1 is a second signal generating unit corresponding to the second receiving unit 13, and outputs a second input signal taken by the second receiving unit 13.

The first receiving unit 12 receives an input signal provided from the delta-sigma modulator DSM0. The first receiving unit 12, together with the clock control unit provided therein (not shown) outputs the synchronous clock DSMCLK generated to the delta-sigma modulator DSM0, captures the input signal at a timing synchronized with the synchronous clock DSMCLK. The second receiving unit 13 receives an incoming signal provided from the delta-sigma modulator DSM1. The second receiving unit 13, together with the clock control unit provided therein (not shown) outputs the synchronous clock DSMCLK generated to the delta-sigma modulator DSM1, captures the input signal at a timing synchronized with the synchronous clock DSMCLK.

In the embodiment shown in FIG. 2, the first receiving unit 12 has a DSM interface 12a and a digital filter 12b. The DSM interface 12a outputs the synchronous clock DSMCLK generated by the clock control unit provided therein to the delta-sigma modulator DSM0 and captures the input signal DSMDAT at the timing synchronized with the synchronous clock DSMCLK. Further, since the input signal DSMDAT is serial data, the DSM interface 12a decodes the captured input signal DSMDAT to generate a received value indicating one value by parallel data at a predetermined cycle. The digital filter 12b performs a digital filtering process, such as a FIR filter, on the received value to generate a first received signal.

Further, in the embodiment shown in FIG. 2, the second receiving unit 13 has a DSM interfacing 13a and a digital filter 13b. The DSM interface 13a outputs the synchronous clock DSMCLK generated by the clock control unit provided therein to the delta-sigma modulator DSM1 and captures the input signal DSMDAT at the timing synchronized with the synchronous clock DSMCLK. Further, since the input signal DSMDAT is serial data, the DSM interfacing 13a decodes the captured input signal DSMDAT to generate a received value indicating one value by parallel data at a predetermined cycle. The digital filter 13b performs a digital filtering process, such as a FIR filter, on the received value to generate a second received signal.

The error determination unit 14 compares a first receiving signal generated by the first receiving unit 12 with a second receiving signal generated by the second receiving unit 13, and outputs an error notification to the upper system in response to the error between the channels of the second receiving signal is equal to or greater than the threshold value. A threshold count register 17 stores a threshold count value for setting the length of time until the error determination unit 14 issues the error notification after the inter-channel error becomes equal to or greater than a threshold value. Then, the error determination unit 14 waits for the departure of the error notification until a period specified by the threshold count value has elapsed since the inter-channel error is equal to or greater than the threshold value.

The noise recovery count register 18, after the inter-channel error becomes equal to or greater than the threshold value, stores the noise recovery count value for setting the length of the period after the inter-channel error becomes less than the threshold value. Then, the error determination unit 14, after the inter-channel error becomes equal to or greater than the threshold value, until the period specified by the noise recovery count value from the inter-channel error becomes less than the threshold value has elapsed stops the departure standby of the error notification based on the threshold count value.

Here, the error determination unit 14 includes a comparison value generating circuit 15, a noise counter 16 and an interrupt control unit 19. The comparison value generating circuit 15 compares the value indicated by the first receiving signal and the value indicated by the second receiving signal, the inter-channel error is an error occurring between the two signals determines whether or not the threshold value or more. Then, the comparison value generating circuit 15, in response to the inter-channel error is determined to be equal to or greater than the threshold value, switches the noise counter 16 to the enable state.

The noise counter 16 counts the number of processing cycles in which the inter-channel error is equal to or greater than the threshold value. Here, the noise counter 16 has a threshold counter 16a and a noise recovery counter 16b. The threshold counter 16a, the threshold count value stored in the threshold count register 17 as a maximum value, counts down the number of processing cycles of the period in which the inter-channel error is equal to or greater than the threshold value. The threshold counter 16a instructs that the error notification to the interrupt control unit 19 by the count value has become the minimum value to notify the host system. Incidentally, the interrupt control unit 19 outputs an error notification as an interrupt process to the host system.

Further, the noise recovery counter 16*b*, the noise recovery count value stored in the noise recovery count register 18 as a maximum value, after the inter-channel error is equal to or greater than the threshold value, the inter-channel error is less than the threshold counts down the number of processing cycles of the period. Then, the noise recovery counter 16*b* resets the count value of the threshold counter 16*a* to the threshold count value in response to the count value has become the minimum value.

Subsequently, the operation of the semiconductor device 10 will be described with reference to the timing chart. It shows a timing chart for explaining the operation of the semiconductor device according to the first embodiment in FIG. 3. The example shown in FIG. 3, in a state where the signal of the same value as the first receiving signal and the second receiving signal is generated, the noise is generated only for the second receiving signal in the timing T11 and timing T21 is an example. Further, in the example shown in FIG. 3, the threshold count value 3, the noise recovery count value 3, the minimum value of each count value and 0.

Figure 3:
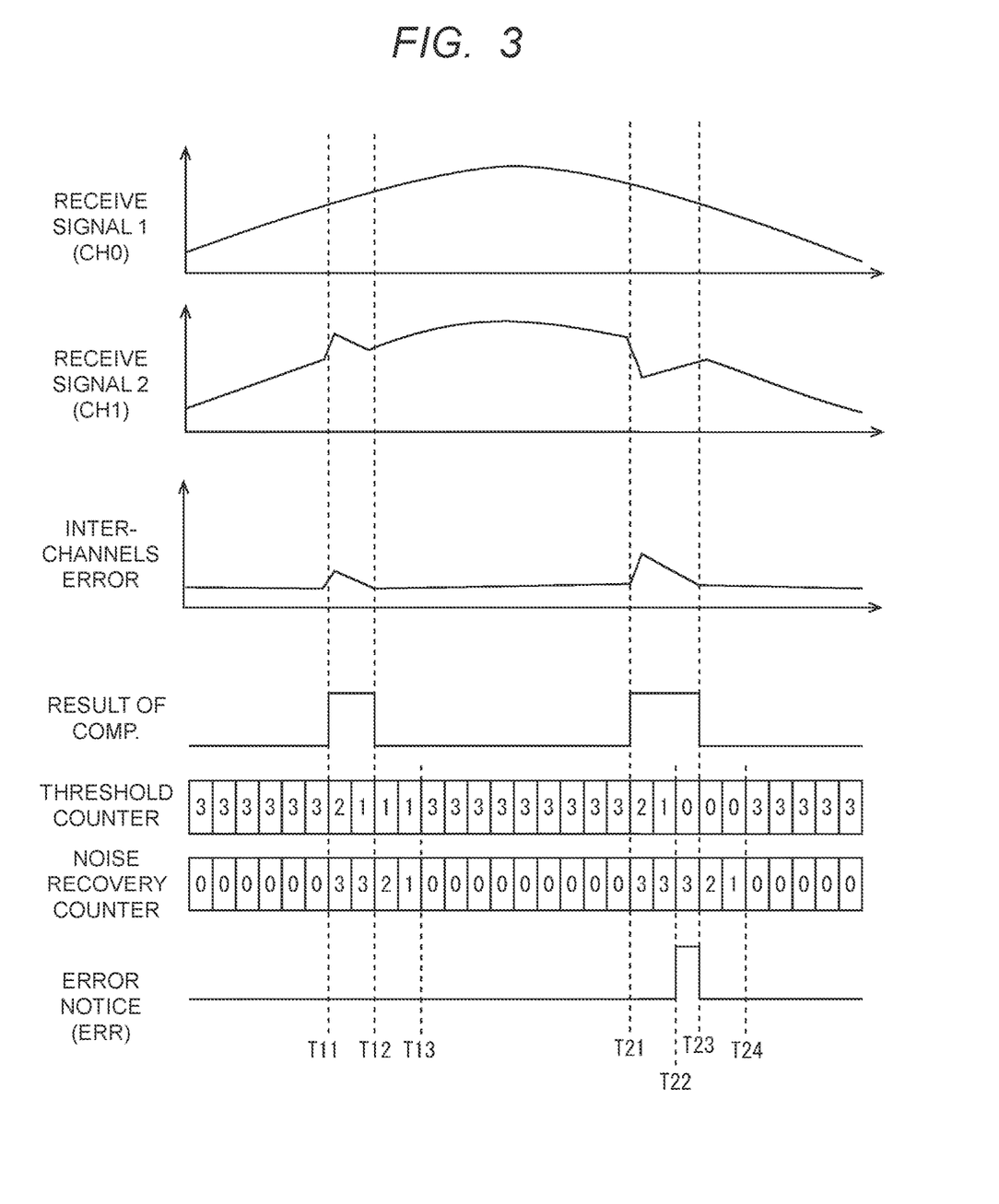
FIG. 3 is a timing chart for explaining the operation of the semiconductor device according to the first embodiment.

In such a case, the semiconductor device 10, the threshold counter 16*a* of the error determination unit 14 due to the noise generation of the timing T11 counts down the count value. In addition, the noise recovery counter 16*b* sets the noise recovery count value as the count value in the timing T11. Then, the threshold counter 16*a* in response to the inter-channel error in the timing T12 of the third cycle from the timing T11 is less than the threshold stops counting down, the noise recovery counter 16*b* starts counting down. Then, the count value of the noise recovery counter 16*b* at the timing T13 of the third cycle from the timing T12 in response to a minimum value (e.g., 0), the count value of the threshold counter 16*a* is reset to the threshold count value.

Also, with respect to the noise generated in the timing T21, greater than the noise generated in the timing T11. In the semiconductor device 10, the threshold counter 16*a* of the error determination unit 14 due to the noise generation of the timing T21 counts down the count value. In addition, the noise recovery counter 16*b* sets the noise recovery count value as the count value in the timing T21. Then, since the inter-channel error in the timing T22 of the third cycle from the timing T21 is equal to or greater than the threshold value, the count value of the threshold counter 16*a* is the minimum value (e.g., 0) by, the threshold counter 16*a* issues an error notification via the interrupt control unit 19. Then, the threshold counter 16*a* in response to the inter-channel error in the timing T23 to be the next cycle of the timing T22 is less than the threshold stops counting down, the noise recovery counter 16*b* starts counting down. Then, the count value of the noise recovery counter 16*b* at the timing T24 of the third cycle from the timing T23 in response to a minimum value (e.g., 0), the count value of the threshold counter 16*a* is reset to the threshold count value.

From the above description, the semiconductor device 10 according to the first embodiment, ideally receives an input signal having the same value in a plurality of channels, and a hardware for performing a process of issuing an error notification based on an error between the plurality of channels. Thus, in the semiconductor device 10 according to the first embodiment, the fixing of the input terminal, the detection of failure such as disconnection of the signal path outside the semiconductor device 10 can be performed without using software processing. That is, the semiconductor device 10 according to the first embodiment can ensure functional safety only by hardware processing. Further, by using the semiconductor device according to the first embodiment, it is possible to accommodate a configuration in which the isolation between the different power supply systems is realized by hardware such as a delta-sigma modulator DSM.

Further, in the semiconductor device 10 according to the first embodiment, by realizing the error detection by hardware processing, it is possible to reduce the software processing load. Further, in the semiconductor device 10 according to the first embodiment, it is possible to flexibly change the threshold exceeding number of error determination range and inter-channel error by providing the threshold count register 17 and the noise recovery count register 18.

Second Embodiment

In a second embodiment, a semiconductor device 20 different from the semiconductor device 10 according to the first embodiment will be described. Incidentally, explanations for the same components as the first embodiment in the second embodiment will be omitted and they have the same reference numerals as the first embodiment.

Figure 4:
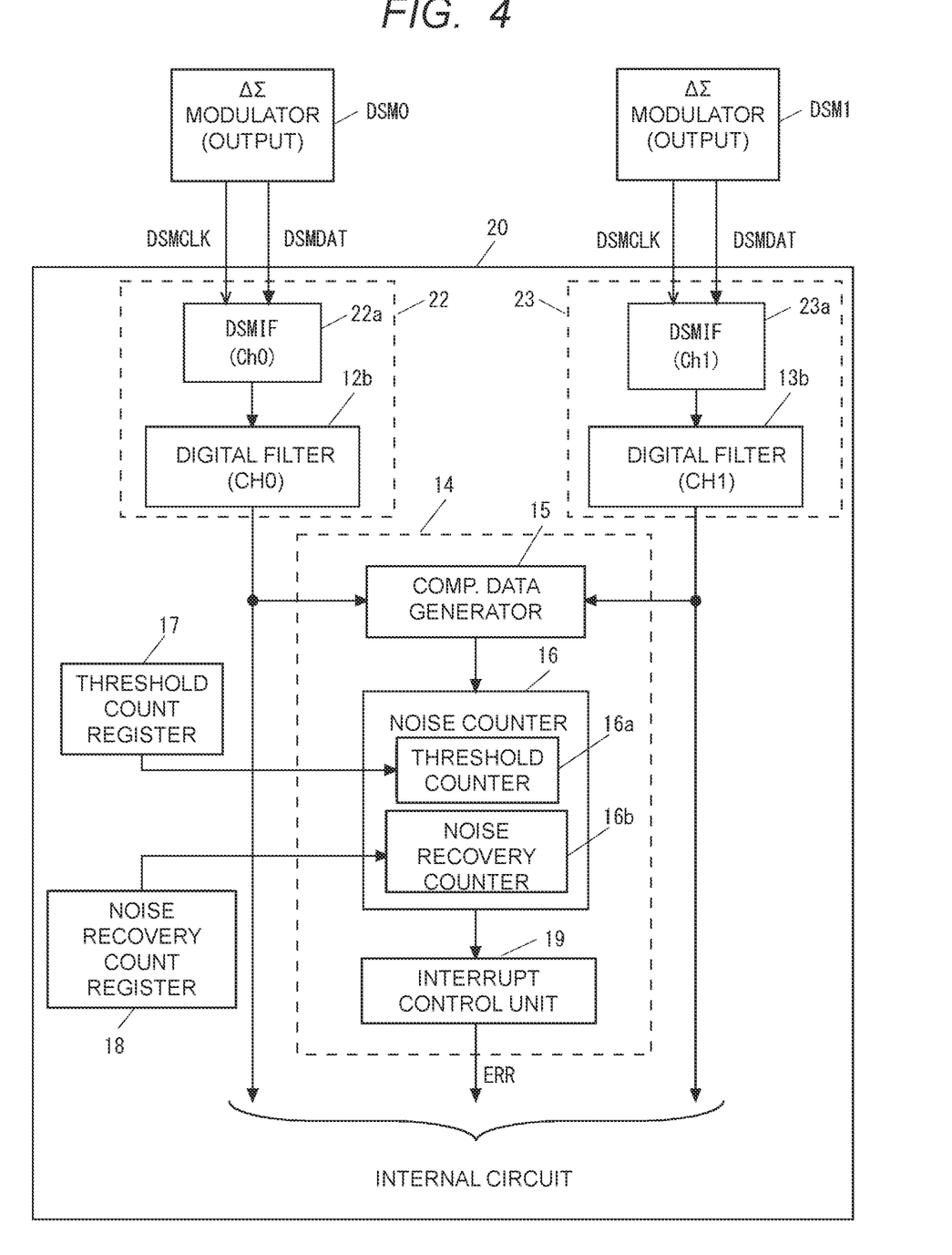
FIG. 4 is a block diagram of a semiconductor device according to a second embodiment.

FIG. 4 shows a block diagram of the semiconductor device according to the second embodiment. As shown in FIG. 4, the first signal generating circuit corresponding to the semiconductor device 20 according to the second embodiment (e.g., delta-sigma modulator DSM0) and the second signal generating unit (e.g., delta-sigma modulator DSM1) outputs a synchronous clock DSMCLK by itself. Also, the delta-sigma modulators DSM0, DSM1 operate asynchronously with each other.

Further, the semiconductor device 20 has a first receiving unit 22 and a second receiving unit 23 for capturing an input signal DSMDAT based on a synchronous clock DSMCLK provided from the delta-sigma modulator. The first receiving unit 22 has a DSM interface 22*a* that generates a received value based on the synchronous clock DSMCLK provided from the delta-sigma modulator DSM0. The second receiving unit 23 also has a DSM interface 23*a* that generates a received value based on a synchronous clock DSMCLK provided from the delta-sigma modulator DSM1.

In the semiconductor device 20 according to the second embodiment, if there is no frequency deviation between the two synchronous clocks DSMCLKs, since the relative relationship between the data capture timing and the number of times in the first receiving unit 32 and the second receiving unit 33 is not shifted with time, the semiconductor device 20 can perform the same operation as the semiconductor device 10 according to the first embodiment 1. Therefore, it shows a timing chart for explaining the operation when there is no frequency deviation between the asynchronous input signal in the semiconductor device according to the second embodiment in FIG. 5.

Figure 5:
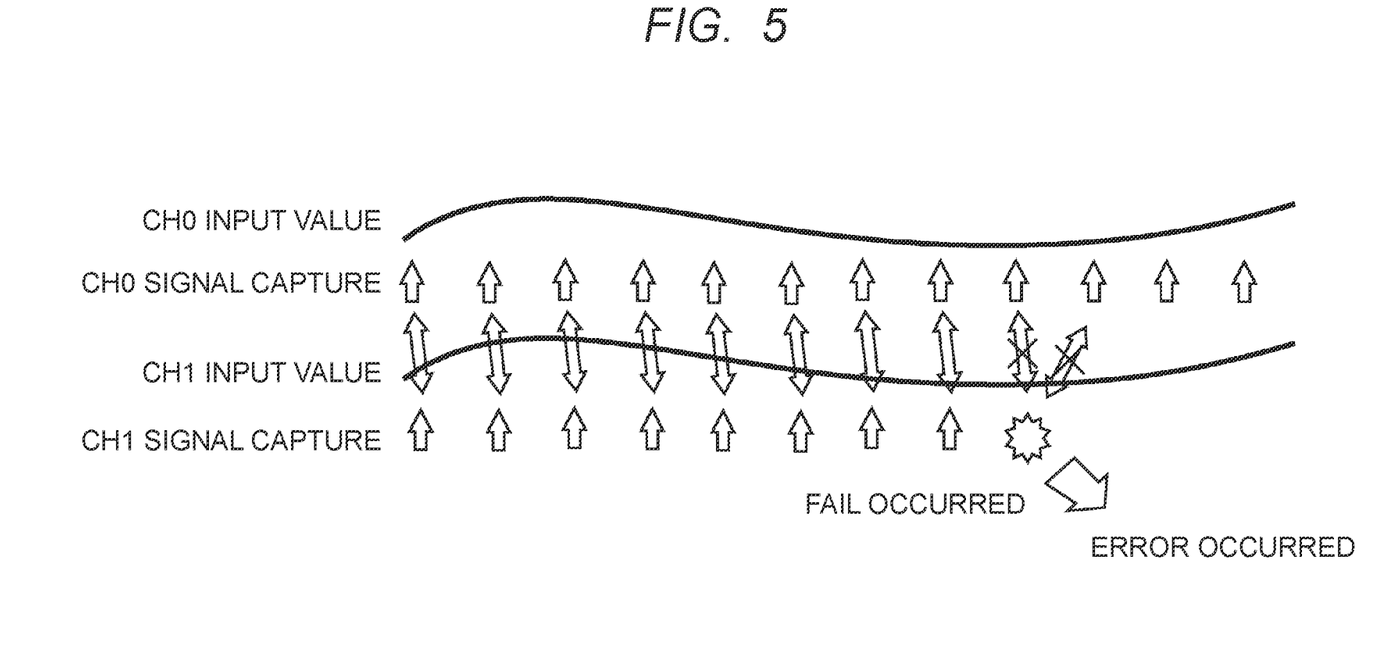
FIG. 5 is a timing chart for explaining the operation when there is no frequency deviation between the asynchronous input signal in the semiconductor device according to the second embodiment.

As shown in FIG. 5, when there is no frequency deviation between the asynchronous input signal, by comparing the value of the same number of acquisitions between channels, the error determination unit 14 can notify an error by detecting any change such as either one of the inputs is lost, or the error is larger compared to before, etc.

Figure 6:
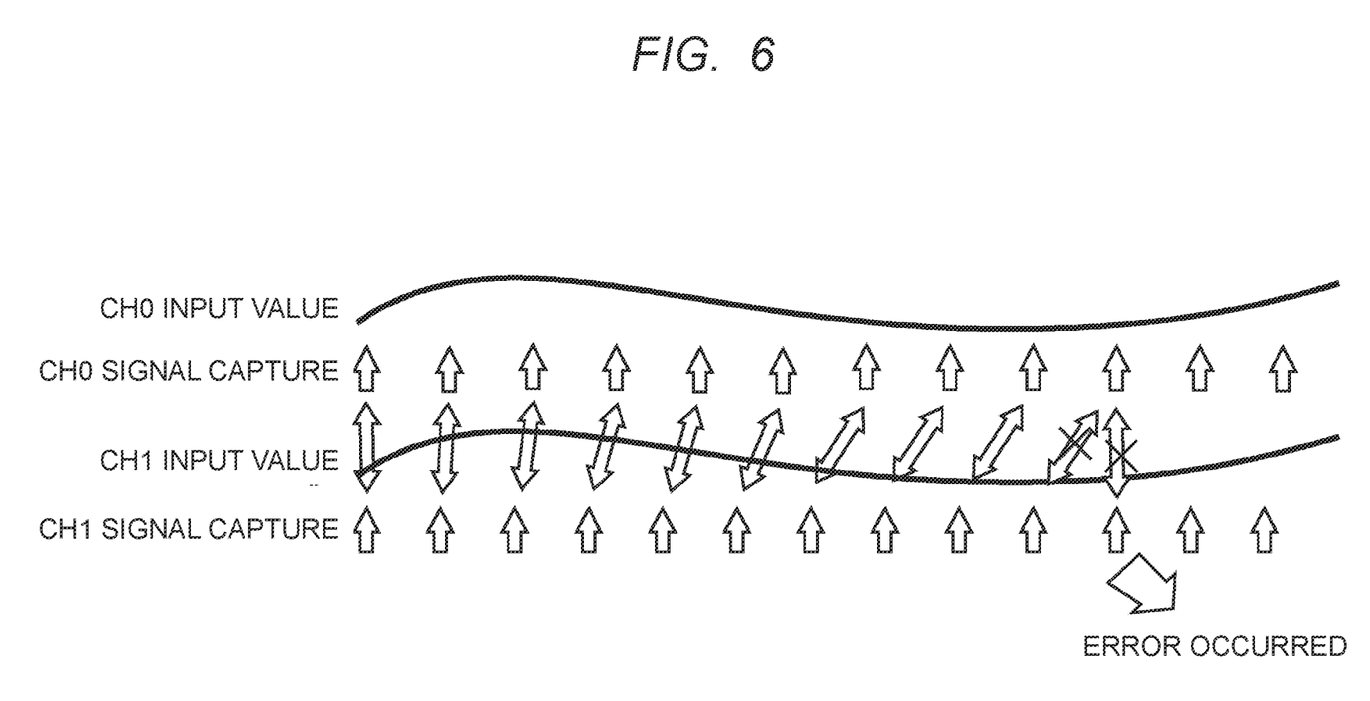
FIG. 6 is a timing chart for explaining the operation when there is a frequency deviation between the asynchronous input signal in the semiconductor device according to the second embodiment.

On the other hand, when an inter-channel error occurs between the asynchronous input signal, the operation different from the first embodiment is required. Therefore, it shows a timing chart for explaining the operation when there is a frequency deviation between the asynchronous input signal in the semiconductor device 20 according to the second embodiment in FIG. 6. FIG. 6 shows an example when the frequency of the channel CH1 becomes slightly faster than the channel CH0. If such a frequency deviation occurs between channels, it becomes difficult to compare the values of the same capture order at a certain point, there is a possibility that error detection is erroneously performed. Therefore, the error determination unit 14 according to the second embodiment, by detecting the deviation of the synchronous clock, the error caused by the deviation of the synchronous clock has a function of error undetected as a pseudo error.

Thus, in the semiconductor device 20 according to the second embodiment, even when employing a delta-sigma modulator DSM to asynchronously operate with respect to each other as a signal generating circuit, by processing the error caused by the frequency deviation as pseudo error, it is possible to avoid an error erroneous detection and the occurrence of software processing due to the error erroneous detection.

Third Embodiment

In a third embodiment, a semiconductor device 30 different from the semiconductor device 10 according to the first embodiment will be described. Incidentally, explanations for the same components as the first embodiment in the third embodiment will be omitted and they have the same reference numerals as the first embodiment.

Figure 7:
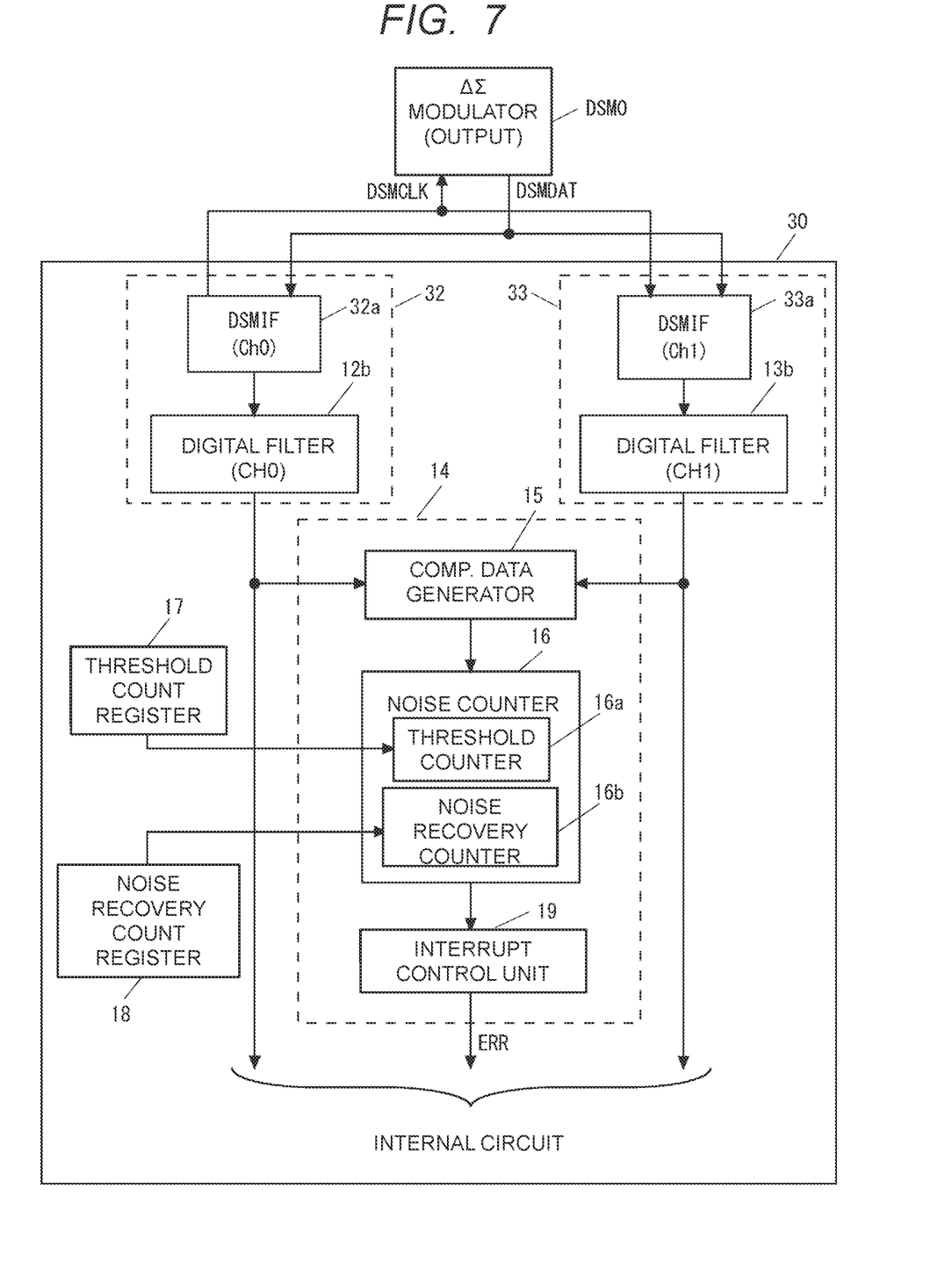
FIG. 7 is a block diagram of a semiconductor device according to a third embodiment.

FIG. 7 shows a block diagram of the semiconductor device 30 according to the third embodiment. As shown in FIG. 7, in the third embodiment, the delta-sigma modulator corresponding to the semiconducting device 30 is only a delta-sigma modulator DSM0. The delta-sigma modulator DSM0 corresponding to the semiconductor device 30 according to the third embodiment receives a synchronous clock DSMCLK from CH0 channel 32a. The delta-sigma modulator DSM0 also transmits one output signal to the semiconductor device 30 via a branched path to provide the same input signal to DSM interfaces 32a, 33a. On the other hand, the DSM interface 33a of the semiconductor device 30 receives the synchronous clock from the DSM interface 32a.

Then, in the semiconductor device 30, a first receiving unit 32 and a second receiving unit 33 capture the input signals DSMDAT based on the synchronous clock outputted from the DSM interface 32a. The first receiving unit 32 has the DSM interface 32a for generating a received value based on the synchronous clock DSMCLK generated by the own machine. The second receiving unit 33 includes the DSM interface 33a for generating a reception value based on the synchronization clock DSMCLK provided from the DSM interface 32a. Then, the DSM interfaces 32a, 33a capture input signals using the clock edge of the synchronous clock DSMCLK phase differs from each other 180°.

Figure 8:
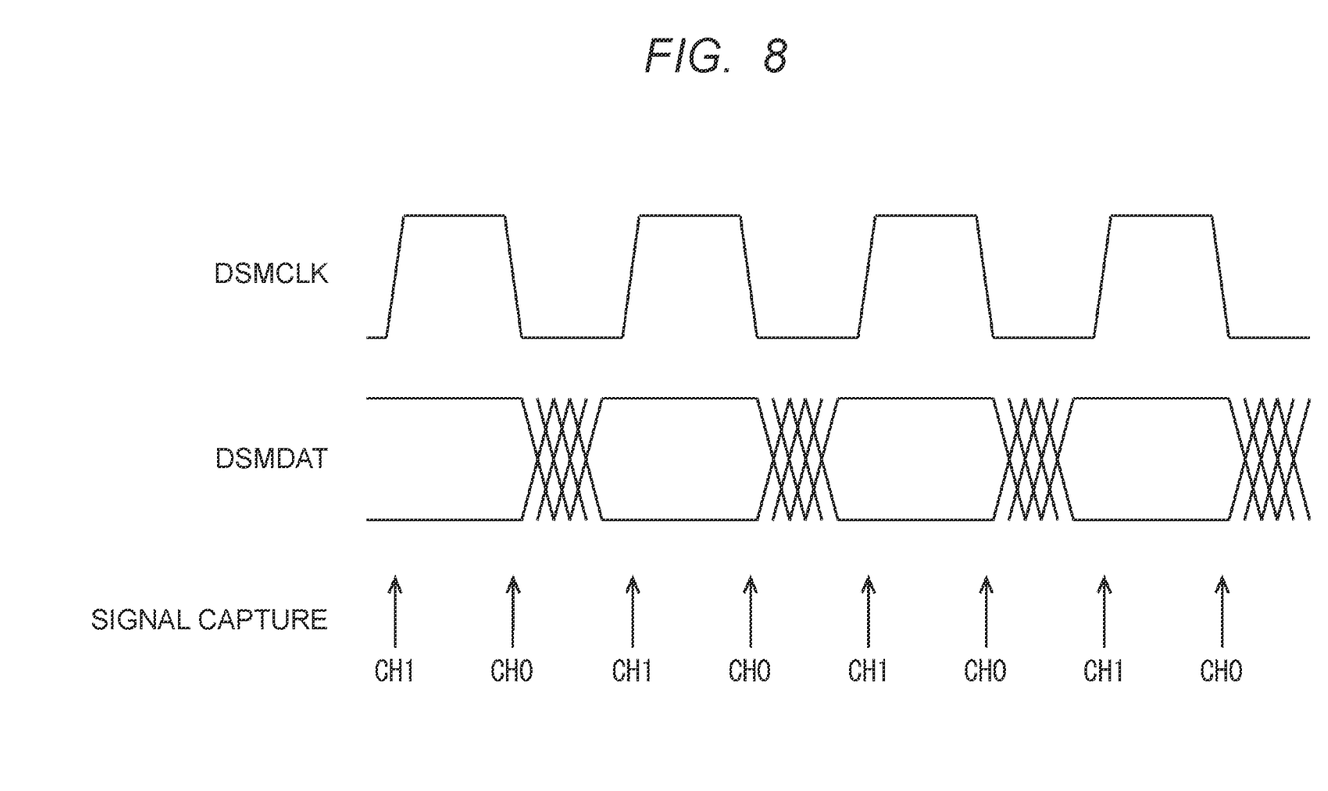
FIG. 8 is a timing chart for explaining the operation of the semiconductor device according to the third embodiment.
Figure 9:
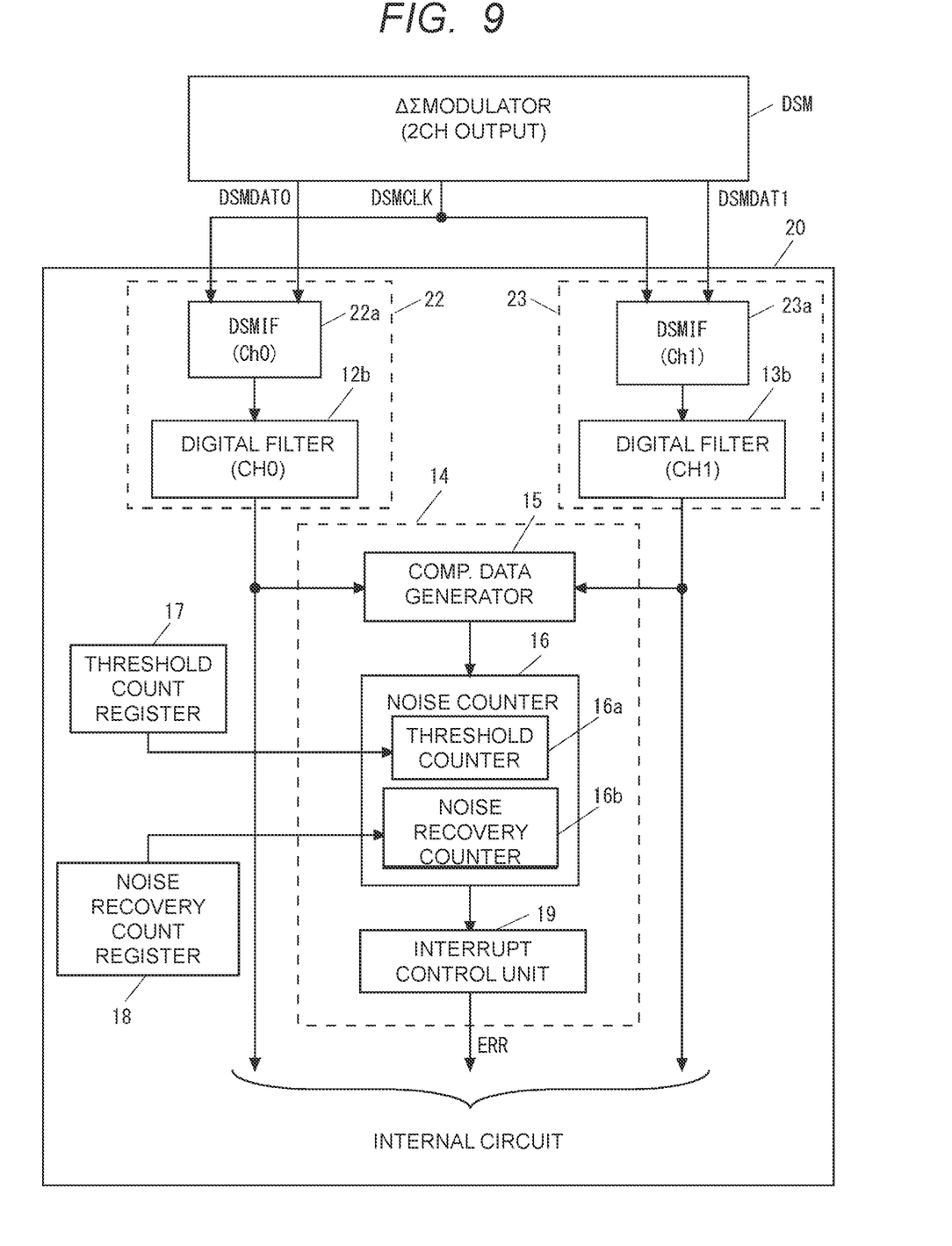
FIG. 9 is a block diagram of a semiconductor device according to the third embodiment.

Therefore, it shows a timing chart for explaining the operation of the semiconductor device according to the third embodiment in FIG. 8. In the illustrative example shown in FIG. 8, the DSM interface 32a captures data on the falling edge of the synchronous clock DSMCLK, and the DSM interface 33a captures data on the rising edge of the synchronous clock DSMCLK.

By capturing data, it is possible to obtain a timing margin for speeding up the synchronous clock DSMCLK. On the other hand, by capturing data at different timings on two channels, the two channels always acquire the same data while shifting the timing, so that no difference occurs between the two data. Thus, in the semiconductor device 30 according to the third embodiment, it is possible to compare in the error determination unit 14 without considering the margin relating to analog-to-digital conversion between the channels.

Fourth Embodiment

In the fourth embodiment, one delta-sigma modulator is provided for the semiconductor device 20 according to the second embodiment. Then, the delta-sigma modulator DSM, while outputting one synchronous clock DSMCLK for the two channels of the semiconductor device 20, and outputs an input signal DSMCLK of the two channels.

With such a configuration, since the same synchronous clock is supplied to the two channels, it is possible to prevent the occurrence of frequency deviation between the channels. Thus, in the semiconductor device 20 according to the fourth embodiment, it is possible to omit the pseudo error prevention function due to the frequency deviation.

Although the invention made by the inventor has been specifically described based on the embodiment, the present invention is not limited to the embodiment already described, and it is needless to say that various modifications can be made without departing from the gist thereof.

What is claimed is:
1. A semiconductor device comprising:
   a first receiving unit for receiving an input signal given from a signal generating unit at external and generating a first receiving signal from the input signal;
   a second receiving unit for receiving the input signal and generating a second receiving signal from the input signal;
   an error determination unit for comparing the first receiving signal with the second receiving signal, and outputting an error notification in response that inter-channel error is equal to or greater than a threshold value; and
   a threshold count register for storing a threshold count value that sets a length of time from when the inter-channel error becomes equal to or greater than the threshold value to when the error notification is issued by the error determination unit; and
   a threshold counter for counting down the number of processing cycles during a period in which the inter-channel error is greater than or equal to the threshold value, with the threshold count value as the maximum value;
   a noise recovery count register for storing a noise recovery count value for setting the length of the period after the inter-channel error becomes less than the threshold value after the inter-channel error becomes equal to or greater than the threshold value; and
   a noise recovery counter for counting down the number of processing cycles of the period during which the error between the channels becomes less than the threshold value, the threshold counter in response to the count value has become the minimum value and resetting the count value to the threshold count value the noise recovery count value as a maximum value, after the inter-channel error becomes equal to or greater than the threshold value,
   wherein the error determination unit waits to issue the error notification until a period designated by the threshold count value elapses after the inter-channel error reaches or exceeds the threshold value, and
   wherein the error determination unit issues the error notification in response to the count value of the threshold counter reaching a minimum value.
2. The semiconductor device according to claim 1, wherein the first receiving unit and the second receiving unit transmits a synchronous clock defining a data transmission cycle to the signal generating unit, for capturing the input signal based on the synchronous clock.

3. The semiconductor device according to claim 1,
wherein the signal generating unit has a first signal generating unit for outputting a first input signal and a first synchronous clock corresponding to the first receiving unit, and a second signal generating unit for outputting a second input signal and a second synchronous clock corresponding to the second receiving unit, and
wherein the first synchronous clock and the second synchronous clock has a clock cycle asynchronous to each other.

4. The semiconductor device according to claim 3, wherein the error determining unit detects a deviation of the synchronous clock and does not detect an error caused by the deviation of the synchronous clock as a pseudo error.

5. The semiconductor device according to claim 1,
wherein the signal generating unit outputs a set of the input signals and a synchronous clock used for capturing the set of the input signals, and
wherein the first receiving unit and the second receiving unit capture the input signal at edges of the synchronous clock that is 180° out of phase with each other.

6. The semiconductor device according to claim 1, wherein the signal generating unit outputs input signals to the first receiving unit and the second receiving unit, and outputs a synchronous clock corresponding to the input signals to the first receiving unit and the second receiving unit.

7. A semiconductor device comprising:
a first receiving unit for receiving an input signal given from a signal generating unit at external and generating a first receiving signal from the input signal;
a second receiving unit for receiving the input signal and generating a second receiving signal from the input signal;
an error determination unit for comparing the first receiving signal with the second receiving signal, and outputting an error notification in response that inter-channel error is equal to or greater than a threshold value; and
a threshold count register for storing a threshold count value that sets a length of time from when the inter-channel error becomes equal to or greater than the threshold value to when the error notification is issued by the error determination unit,
wherein the error determination unit waits to issue the error notification until a period designated by the threshold count value elapses after the inter-channel error reaches or exceeds the threshold value,
wherein the signal generating unit has a first signal generating unit for outputting a first input signal and a first synchronous clock corresponding to the first receiving unit, and a second signal generating unit for outputting a second input signal and a second synchronous clock corresponding to the second receiving unit, and
wherein the first synchronous clock and the second synchronous clock has a clock cycle asynchronous to each other.

8. A semiconductor device comprising:
a first receiving unit for receiving an input signal given from a signal generating unit at external and generating a first receiving signal from the input signal;
a second receiving unit for receiving the input signal and generating a second receiving signal from the input signal;
an error determination unit for comparing the first receiving signal with the second receiving signal, and outputting an error notification in response that inter-channel error is equal to or greater than a threshold value; and
a threshold count register for storing a threshold count value that sets a length of time from when the inter-channel error becomes equal to or greater than the threshold value to when the error notification is issued by the error determination unit,
wherein the error determination unit waits to issue the error notification until a period designated by the threshold count value elapses after the inter-channel error reaches or exceeds the threshold value,
wherein the signal generating unit outputs a set of the input signals and a synchronous clock used for capturing the set of the input signals, and
wherein the first receiving unit and the second receiving unit capture the input signal at edges of the synchronous clock that is 180° out of phase with each other.

* * * * *